US012772540B2

(12) United States Patent
Lin

(10) Patent No.: US 12,772,540 B2
(45) Date of Patent: Oct. 20, 2026

(54) SEMICONDUCTOR STRUCTURE AND MANUFACTURING METHOD THEREOF

(71) Applicant: UNITED MICROELECTRONICS CORP., Hsin-Chu City (TW)

(72) Inventor: Chun-Hao Lin, Kaohsiung City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 814 days.

(21) Appl. No.: 17/970,532

(22) Filed: Oct. 20, 2022

(65) Prior Publication Data

US 2024/0105809 A1 Mar. 28, 2024

(30) Foreign Application Priority Data

Sep. 23, 2022 (TW) .................................. 111136126

(51) Int. Cl.
*H10D 64/68* (2025.01)
*H01L 21/02* (2006.01)
(Continued)

(52) U.S. Cl.
CPC ........... *H10D 64/685* (2025.01); *H10D 64/01* (2025.01); *H10D 64/017* (2025.01);
(Continued)

(58) Field of Classification Search
CPC ........ H10D 30/62–6219; H10D 30/024–0245; H10D 64/512; H10D 64/517; H10D 64/518; H10D 64/68–693; H10D 64/675; H10D 64/679; H10D 64/021; H10D 64/017; H10D 64/514; H10D 84/0144; H10D 84/0147; H10D 84/0181; H10D 84/0184; H10D 84/83; H10D 84/8314; H10D 84/8316; H10D 84/0158; H10D 84/834; H10D 62/102–112; H10D 62/01; H10D 62/117;
(Continued)

(56) References Cited

U.S. PATENT DOCUMENTS

| | | | | |
|---|---|---|---|---|
| 9,406,772 | B1 | 8/2016 | Wang | |
| 2013/0009257 | A1 * | 1/2013 | Ando | H10D 64/017 257/E21.409 |

(Continued)

FOREIGN PATENT DOCUMENTS

| | | | |
|---|---|---|---|
| KR | 10-2007-0027789 | A | 3/2007 |
| KR | 10-2020-0019820 | A | 2/2020 |
| KR | 10-2021-0032874 | A | 3/2021 |

*Primary Examiner* — Zandra V Smith
*Assistant Examiner* — Douglas Yap
(74) *Attorney, Agent, or Firm* — Winston Hsu

(57) ABSTRACT

A semiconductor structure includes a semiconductor substrate, a first gate structure, and a first spacer structure. The semiconductor substrate includes a first active structure, and the first gate structure is disposed on the first active structure. The first gate structure includes a first gate oxide layer and a first high dielectric constant (high-k) dielectric layer. The first gate oxide layer includes a U-shaped structure in a cross-sectional view of the first gate structure, and the first high-k dielectric layer is disposed on the first gate oxide layer The first spacer structure is disposed on a sidewall of the first gate structure, and a first portion of the gate oxide layer is located between the first spacer structure and the first high-k dielectric layer in a horizontal direction.

10 Claims, 4 Drawing Sheets

(51) Int. Cl.

| | |
|---|---|
| ***H10D 64/01*** | (2025.01) |
| ***H10D 84/83*** | (2025.01) |
| ***H10P 14/60*** | (2026.01) |
| *H10D 64/66* | (2025.01) |

(52) U.S. Cl.
CPC ......... *H10D 64/681* (2025.01); *H10D 84/834* (2025.01); *H10P 14/6304* (2026.01); *H10P 14/6339* (2026.01); *H10D 64/021* (2025.01); *H10D 64/675* (2025.01); *H10D 64/693* (2025.01)

(58) Field of Classification Search
CPC .... H10D 62/124; H10D 62/343; H10D 64/01; H10D 64/681; H10D 64/685
See application file for complete search history.

(56) References Cited

U.S. PATENT DOCUMENTS

| | | | | |
|---|---|---|---|---|
| 2014/0183642 | A1* | 7/2014 | Liang | H10D 84/0144 438/299 |
| 2016/0225872 | A1* | 8/2016 | Wang | H10D 64/017 |
| 2017/0077257 | A1* | 3/2017 | Hung | H10D 64/518 |
| 2020/0365733 | A1* | 11/2020 | Song | H10D 62/151 |
| 2022/0271148 | A1* | 8/2022 | Huang | H10D 30/43 |

* cited by examiner

SEMICONDUCTOR STRUCTURE AND MANUFACTURING METHOD THEREOF

BACKGROUND OF THE INVENTION

1. Field of the Invention

The present invention relates to a semiconductor structure and a manufacturing method thereof, and more particularly, to a semiconductor structure including a gate oxide layer and a manufacturing method thereof.

2. Description of the Prior Art

In the integrated circuit, transistors may be different from one another in structure for different operation voltages. For example, the transistors for relatively low operation voltage may be applied in core devices, input/output (I/O) devices, and so on. The transistors capable of high voltage processing may be applied in high operation voltage environment such as CPU power supply, power management system, AC/DC converter, and high-power or high frequency (HF) band power amplifier. However, in order to form transistors corresponding to different operation voltages on the same wafer or chip, the processes are often complicated and the processes of different transistors may affect each other. Therefore, how to improve the related problems through the design of structure and/or the design of process is a continuous issue for those in the related fields.

SUMMARY OF THE INVENTION

A semiconductor structure and a manufacturing method thereof are provided in the present invention. A gate oxide layer with a U-shaped structure is used to adjust a gate oxide thickness in a gate structure and reduce negative influence of related manufacturing processes accordingly.

According to an embodiment of the present invention, a semiconductor structure is provided. The semiconductor structure includes a semiconductor substrate, a first gate structure, and a first spacer structure. The semiconductor substrate includes a first active structure, and the first gate structure is disposed on the first active structure. The first gate structure includes a first gate oxide layer and a first high dielectric constant (high-k) dielectric layer. The first gate oxide layer includes a U-shaped structure in a cross-sectional view of the first gate structure, and the first high-k dielectric layer is disposed on the first gate oxide layer. The first spacer structure is disposed on a sidewall of the first gate structure, and a first portion of the first gate oxide layer is located between the first spacer structure and the first high-k dielectric layer in a horizontal direction.

According to an embodiment of the present invention, a manufacturing method of a semiconductor structure is provided. The manufacturing method includes the following steps. A semiconductor substrate is provided, and the semiconductor substrate includes a first active structure. A first gate structure is formed on the first active structure, and the first gate structure includes a first gate oxide layer and a first high dielectric constant (high-k) dielectric layer. The first gate oxide layer includes a U-shaped structure in a cross-sectional view of the first gate structure, and the first high-k dielectric layer is disposed on the first gate oxide layer. A first spacer structure is formed. The first spacer structure is disposed on a sidewall of the first gate structure, and a first portion of the first gate oxide layer is located between the first spacer structure and the first high-k dielectric layer in a horizontal direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating a manufacturing method of a semiconductor structure according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
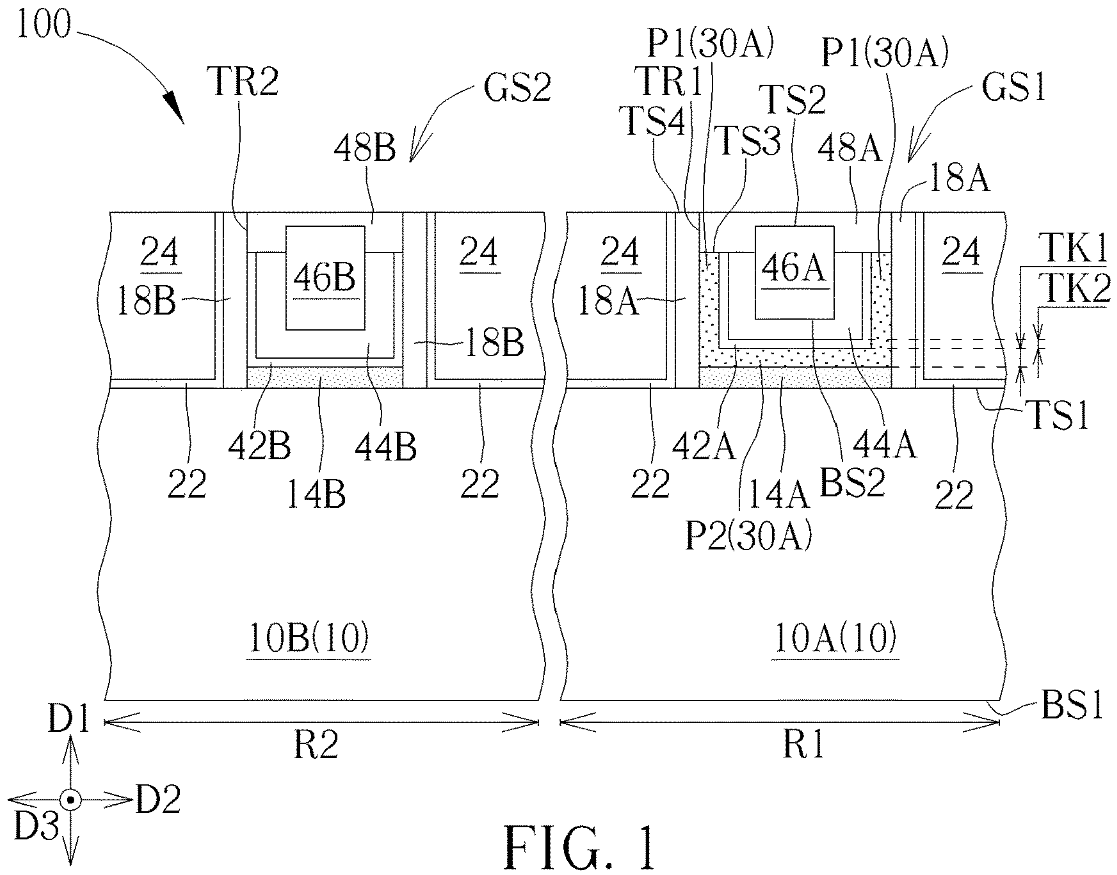
FIG. 1 is a schematic drawing illustrating a semiconductor structure according to an embodiment of the present invention.

Please refer to FIG. 1. FIG. 1 is a schematic drawing illustrating a semiconductor structure 100 according to an embodiment of the present invention. As shown in FIG. 1, the semiconductor structure 100 includes a semiconductor substrate 10, a first gate structure GS1, and a first spacer structure 18A. The semiconductor substrate 10 includes a first active structure 10A, and the first gate structure GS1 is disposed on the first active structure 10A. The first gate structure GS1 includes a first gate oxide layer (such as a gate oxide layer 30A illustrated in FIG. 1) and a first high dielectric constant (high-k) dielectric layer 42A. The gate oxide layer 30A includes a U-shaped structure in a cross-sectional view of the first gate structure GS1 (such as FIG. 1). The first high-k dielectric layer 42A is disposed on the first gate oxide layer 30A. The first spacer structure 18A is disposed on a sidewall of the first gate structure GS1, and a first portion P1 of the gate oxide layer 30A is located between the first spacer structure 18A and the first high-k dielectric layer 42A in a horizontal direction (such as a direction D2 illustrated in FIG. 1).

In some embodiments, the semiconductor substrate 10 may have a top surface TS1 and a bottom surface BS1 opposite to the top surface TS1 in a vertical direction (such as a direction D1 illustrated in FIG. 1), and the first gate structure GS1 and the first spacer structure 18A described above may be disposed at a side of the top surface TS1. In some embodiments, the direction D1 may be regarded as a thickness direction of the semiconductor substrate 10, and horizontal directions substantially orthogonal to the direction D1 (such as the direction D2 and a direction D3 illustrated in FIG. 1 and other directions orthogonal to the direction D1) may be substantially parallel with the top surface TS1 and/or the bottom surface BS1 of the semiconductor substrate 10, but not limited thereto. In this description, a distance between the bottom surface BS1 of the semiconductor substrate 10 and a relatively higher location and/or a relatively higher part in the vertical direction (such as the direction D1) may be greater than a distance between the bottom surface BS1 of the semiconductor substrate 10 and a relatively lower location and/or a relatively lower part in the direction D1. The bottom or a lower portion of each component may be closer to the bottom surface BS1 of the semiconductor substrate 10 in the direction D1 than the top or upper portion of this component. Another component disposed above a specific component may be regarded as being relatively far from the bottom surface BS1 of the semiconductor substrate 10 in the direction D1, and another component disposed under a specific component may be regarded as being relatively close to the bottom surface BS1 of the semiconductor substrate 10 in the direction D1.

Specifically, in some embodiments, the first portion P1 of the gate oxide layer 30A may be regarded as a portion extending upwards in the vertical direction (such as the direction D1) in the U-shaped structure, a second portion P2 of the gate oxide layer 30A may be regarded as a portion extending in the horizontal direction (such as the direction D2) in the U-shaped structure, and the second portion P2 may be directly connected with the first portion P1. Additionally, in some embodiments, the first gate structure GS1 may further include a second gate oxide layer (such as a gate oxide layer 14A illustrated in FIG. 1), the gate oxide layer 30A may be disposed on the gate oxide layer 14A, and the gate oxide layer 14A may be disposed between the gate oxide layer 30A and the first active structure 10A in the direction D1. In some embodiments, the gate oxide layer 14A may only include the portion extending in the horizontal direction in the cross-sectional view of the first gate structure GS1 without the portion extending in the vertical direction, the gate oxide layer 14A may be sandwiched between the gate oxide layer 30A and the first active structure 10A in the direction D1, and the gate oxide layer 14A may be directly connected with the gate oxide layer 30A and the first active structure 10A, but not limited thereto. In addition, the second portion P2 of the gate oxide layer 30A may be sandwiched between the first high-k dielectric layer 42A and the gate oxide layer 14A in the direction D1, and the second portion P2 of the gate oxide layer 30A may be directly connected with the first high-k dielectric layer 42A and the gate oxide layer 14A. In some embodiments, the first gate structure GS1 may be regarded as being disposed in a first trench TR1 surrounded by the first spacer structure 18A in the horizontal directions, a projection pattern and/or a projection area of the gate oxide layer 30A in the direction D1 may be substantially the same as or equal to a projection pattern and/or a projection area of the gate oxide layer 14A in the direction D1, and a contact area between the gate oxide layer 30A and the gate oxide layer 14A may be substantially equal to the area of the top surface of the gate oxide layer 14A and/or the area of the bottom surface of the gate oxide layer 30A, but not limited thereto.

In some embodiments, the semiconductor substrate 10 may include a silicon substrate, an epitaxial silicon substrate, a silicon germanium substrate, a silicon carbide substrate, a silicon-on-insulator (SOI) substrate, or a substrate made of other suitable semiconductor materials. The first active structure 10A may be a part of the semiconductor substrate 10, and the material composition of the first active structure 10A may be identical to or similar to that of the semiconductor substrate 10. For example, the first active structure 10A may be a fin-shaped semiconductor structure formed by patterning a part of the semiconductor substrate 10, but not limited thereto. The gate oxide layer 14A may include an oxide layer formed by performing an oxidation treatment to the semiconductor substrate 10, and the gate oxide layer 14A may include oxide of the material of the semiconductor substrate 10, such as silicon oxide, but not limited thereto. In addition, the gate oxide layer 30A may include an oxide layer formed by a deposition process, and the material of the gate oxide layer 30A may include silicon oxide or other suitable oxide dielectric materials, but not limited thereto. The first high-k dielectric layer 42A may include hafnium oxide ($HfO_x$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials, such as a high-k material with dielectric constant higher than the dielectric constant of silicon oxide, but not limited thereto. Therefore, the dielectric constant of the first high-k dielectric layer 42A may be higher than 3.9 or higher than 4.5 (the dielectric constant of silicon oxide generally ranges from 3.9 to 4.5), or the first high-k dielectric layer 42A may have much higher dielectric constant according to other design considerations. In other words, the material composition of the first high-k dielectric layer 42A is different from the material composition of the gate oxide layer 30A and the material composition of the gate oxide layer 14A, and the dielectric constant of the material of the first high-k dielectric layer 42A may be higher than the dielectric constant of the material of the gate oxide layer 30A and the dielectric constant of the material of the gate oxide layer 14A, respectively. Additionally, in some embodiments, the gate oxide layer 30A may be used to increase the total thickness of the gate oxide layer in the first gate structure GS1 for meeting the requirements (such as a requirement for modifying operation voltage, but not limited thereto). Therefore, the thickness of the gate oxide layer 30A (such as a thickness TK1 of the second portion P2 in the direction D1) may be greater than the thickness of the first high-k dielectric layer 42A (such as a thickness TK2 of the portion of the first high-k dielectric layer 42A, which is extending in the horizontal direction, in the direction D1), but not limited thereto.

In some embodiments, the first gate structure GS1 may further include a first electrically conductive layer 44A, a first gate electrode 46A, and a first capping layer 48A. The first gate structure 46A may be disposed on the first high-k dielectric layer 42A, the first electrically conductive layer 44A may be disposed between the first high-k dielectric layer 42A and the first gate electrode 46A, and the first capping layer 48A may be disposed on the gate oxide layer 30A, the first high-k dielectric layer 42A, the first electrically conductive layer 44A, and the first gate electrode 46A in the direction D1. The first electrically conductive layer 44A may include a structure formed with multiple layers of electrically conductive materials stacked with one another, such as a structure made of a bottom barrier layer, a work function layer, and top barrier layer stacked with one another, but not limited thereto. The materials of the barrier layers and the work function layer described above may include titanium nitride (TiN), titanium carbide (TiC), tantalum nitride (TaN), tantalum carbide (TaC), tungsten carbide (WC), titanium tri-aluminide ($TiAl_3$), aluminum titanium nitride (TiAlN), or other suitable electrically conductive materials. The first gate electrode 46A may include a low electrical resistivity material, such as tungsten, aluminum, copper, titanium aluminide, titanium, or other suitable low electrical resistivity materials. The first capping layer 48A may include an insulation material, such as silicon oxide, silicon nitride, or other suitable insulation materials.

In some embodiments, the gate oxide layer 30A, the first high-k dielectric layer 42A, and the first electrically conductive layer 44A may include a U-shaped structure in the cross-sectional view of the first gate structure GS1, respectively, and the U-shaped structures may be disposed stacked with one another in the direction D1 and encompass at least a part of the first gate electrode 46A (such as a lower portion of the first gate electrode 46A), but not limited thereto. Additionally, in some embodiments, a top surface TS3 of the first portion P1 of the gate oxide layer 30A, a top surface of the first high-k dielectric layer 42A, and a top surface of the first electrically conductive layer 44A may be substantially coplanar; the top surface TS3 of the first portion P1, the top surface of the first high-k dielectric layer 42A, and the top surface of the first electrically conductive layer 44A may be lower than a top surface TS2 of the first gate electrode 46A in the direction D1 and higher than a bottom surface BS2 of the first gate electrode 46A in the direction D1; and the top surface TS3 of the first portion P1, the top surface of the first high-k dielectric layer 42A, and the top surface of the first electrically conductive layer 44A may be lower than a top surface TS4 of the first spacer structure 18A in the direction D1, but not limited thereto. In addition, the top surface TS2 of the first gate electrode 46A may be lower than the top surface TS4 of the first spacer structure 18A in the direction D1, and a top surface of the first capping layer 48A and the top surface TS4 of the first spacer structure 18A may be substantially coplanar, but not limited thereto. It is worth noting that, in this description, a top surface of a specific component may include the topmost surface of this component in the direction D1, and a bottom surface of a specific component may include the bottommost surface of this component in the direction D1, but not limited thereto.

In some embodiments, the first spacer structure 18A may include a single layer or multiple layers of insulation materials, such as silicon nitride, silicon oxide, or other suitable insulation materials. The first portion P1 of the gate oxide layer 30A may be sandwiched between the first spacer structure 18A and the first high-k dielectric layer 42A in the horizontal direction (such as the direction D2), and the first portion P1 of the gate oxide layer 30A may be directly connected with the first spacer structure 18A and the first high-k dielectric layer 42A in the direction D2, respectively. In some embodiments, the first spacer structure 18A may surround the first gate structure GS1 in the horizontal directions, and the first spacer structure 18 may be directly connected with the first capping layer 48A, the gate oxide layer 30A, and the gate oxide 14A, but not limited thereto.

In some embodiments, the semiconductor substrate 10 may include a first region R1 and a second region R2, the first active structure 10A may be located in the first region R1, and the first gate structure GS1 and the first spacer structure 18 may be located on the first region R1. Additionally, in some embodiments, the semiconductor structure 100 may further include a second gate structure GS2 and a second spacer structure 18B, and the second gate structure GS2 and the second spacer structure 18B may be disposed on the second region R2 of the semiconductor substrate 10. In some embodiments, the semiconductor substrate 10 may further include a second active structure 10B located in the second region R2, and the second gate structure GS2 and the second spacer structure 18B may be disposed on the second region R2. In some embodiments, similar to the first active structure 10A described above, the second active structure 10B may be a fin-shaped semiconductor structure formed by patterning a part of the semiconductor substrate 10, such as a fin-shaped semiconductor structure elongated in the direction D2, but not limited thereto. In addition, the second gate structure GS2 may include a third gate oxide layer (such as a gate oxide layer 14B illustrated in FIG. 1) and a second high-k dielectric layer 42B, and the second high-k dielectric layer 42B may be disposed on the gate oxide layer 14B. In some embodiments, the gate oxide layer 14B may be sandwiched between the second high-k dielectric layer 42B and the second active structure 10B in the direction D1, and the gate oxide layer 14B may be directly connected with the second high-k dielectric layer 42B and the second active structure 10B, respectively. In some embodiments, the gate oxide layer 14B may include an oxide layer formed by performing an oxidation treatment to the semiconductor substrate 10, and the gate oxide layer 14B may include oxide of the material of the semiconductor substrate 10, such as silicon oxide, but not limited thereto. The second high-k dielectric layer 42B may include high-k dielectric materials similar to the first high-k dielectric layer 42 described above, and the material composition of the second high-k dielectric layer 42 may be identical to or different from the material composition of the first high-k dielectric layer 42A.

In some embodiments, the second gate structure GS2 may further include a second electrically conductive layer 44B, a second gate electrode 46B, and a second capping layer 48B. The second gate electrode 46B may be disposed on the second high-k dielectric layer 42B, the second electrically conductive layer 44B may be disposed between the second high-k dielectric layer 42B and the second gate electrode 46B, and the second capping layer 48B may be disposed on the second high-k dielectric layer 42B, the second electrically conductive layer 44B, and the second gate electrode 46B in the direction D1. The second electrically conductive layer 44B may include a structure formed with multiple layers of electrically conductive materials stacked with one another, such as a structure made of a bottom barrier layer, a work function layer, and top barrier layer stacked with one another, but not limited thereto. The second electrically conductive layer 44B may include electrically conductive materials similar to those in the first electrically conductive layer 44A described above, and the material composition of the second electrically conductive layer 44B may be identical to or different from the material composition of the first electrically conductive layer 44A according to some design considerations. The second gate electrode 46B may include a low electrical resistivity material similar to that in the first gate electrode 46A described above, and the material composition of the second gate electrode 46B may be identical to or different from the material composition of the first gate electrode 46A according to some design considerations. The second capping layer 48B may include an insulation material, such as silicon oxide, silicon nitride, or other suitable insulation materials, and the material composition of the second capping layer 48B may be identical to or different from the material composition of the first capping layer 48A according to some design considerations. In some embodiments, the second high-k dielectric layer 42B and the second electrically conductive layer 44B may include a U-shaped structure in the cross-sectional view of the second gate structure GS2, respectively, and the U-shaped structures may be disposed stacked with one another in the direction D1 and encompass at least a part of the second gate electrode 46B (such as a lower portion of the second gate electrode 46B), but not limited thereto. Additionally, in some embodiments, a top surface of the second high-k dielectric layer 42B and a top surface of the second electrically conductive layer 44B may be substantially coplanar, the top surface of the second high-k dielectric layer 42B and the top surface of the second electrically conductive layer 44B may be lower than a top surface of the second gate electrode 46B and higher than a bottom surface of the second gate electrode 46B in the direction D1, and the top surface of the second high-k dielectric layer 42B and the top surface of the second electrically conductive layer 44B may be lower than a top surface of the second spacer structure 18B, but not limited thereto.

In some embodiments, the second spacer structure 18B may be disposed on a sidewall of the second gate structure GS2, and the second spacer structure 18B may be directly connected with the gate oxide layer 14B, the second high-k dielectric layer 42B, and the second capping layer 48B, respectively. The second gate structure GS2 may be regarded as being disposed in a second trench TR2 surrounded by the second spacer structure 18B in the horizontal directions, a projection pattern and/or a projection area of the second high-k layer 42B in the direction D1 may be substantially the same as or equal to a projection pattern and/or a projection area of the gate oxide layer 14B in the direction D1, and a contact area between the second high-k dielectric layer 42B and the gate oxide layer 14B may be substantially equal to the area of the top surface of the gate oxide layer 14B and/or the area of the bottom surface of the second high-k dielectric layer 42B, but not limited thereto.

Additionally, in some embodiments, the first gate structure GS1 and the second gate structure GS2 may be gate electrodes in different semiconductor devices (such as transistor devices, but not limited thereto), and the difference between the gate oxide thickness in the first gate structure GS1 and the gate oxide thickness in the second gate structure GS2 and/or the difference between the structural composition of the first gate structure GS1 and the structural composition of the second gate structure GS2 may be used for semiconductor devices of different specifications (such as transistor devices with different operation voltages, but not limited thereto). Therefore, the thickness of the gate oxide layer 14B within the second gate structure GS2 in the direction D1 may be less than the total thickness of the gate oxide layer 30A and the gate oxide layer 14A within the first gate structure GS1 in the direction D1 (such as the sum of the thickness TK1 and the thickness of the gate oxide layer 14A in the direction D1). In other words, the gate oxide layer 30A in the first gate structure GS1 may be used to increase the total thickness of the gate oxide layers in the first gate structure GS1 for meeting the design requirement of the corresponding semiconductor device.

In some embodiments, the semiconductor structure 100 may further include an etching stop layer 22 and a dielectric layer 24. The etching stop layer 22 may be disposed on the first region R1 and the second region R2 of the semiconductor substrate 10, and the etching stop layer 22 may be disposed conformally on the sidewall of the first spacer structure 18A and the sidewall of the second spacer structure 18B. The dielectric layer 24 may be disposed on the etching stop layer 22. The top surface of the dielectric layer 24, the top surface of the etching stop layer 22, the top surface of the first spacer structure 18A, the top surface of the second spacer structure 18B, the top surface of the first capping layer 48A, and the top surface of the second capping layer 48B may be substantially coplanar, but not limited thereto. The etching stop layer 22 may include silicon nitride or other suitable insulation materials, and the dielectric layer 24 may include silicon oxide or other dielectric materials different from the material of the etching stop layer 22.

Figure 2:
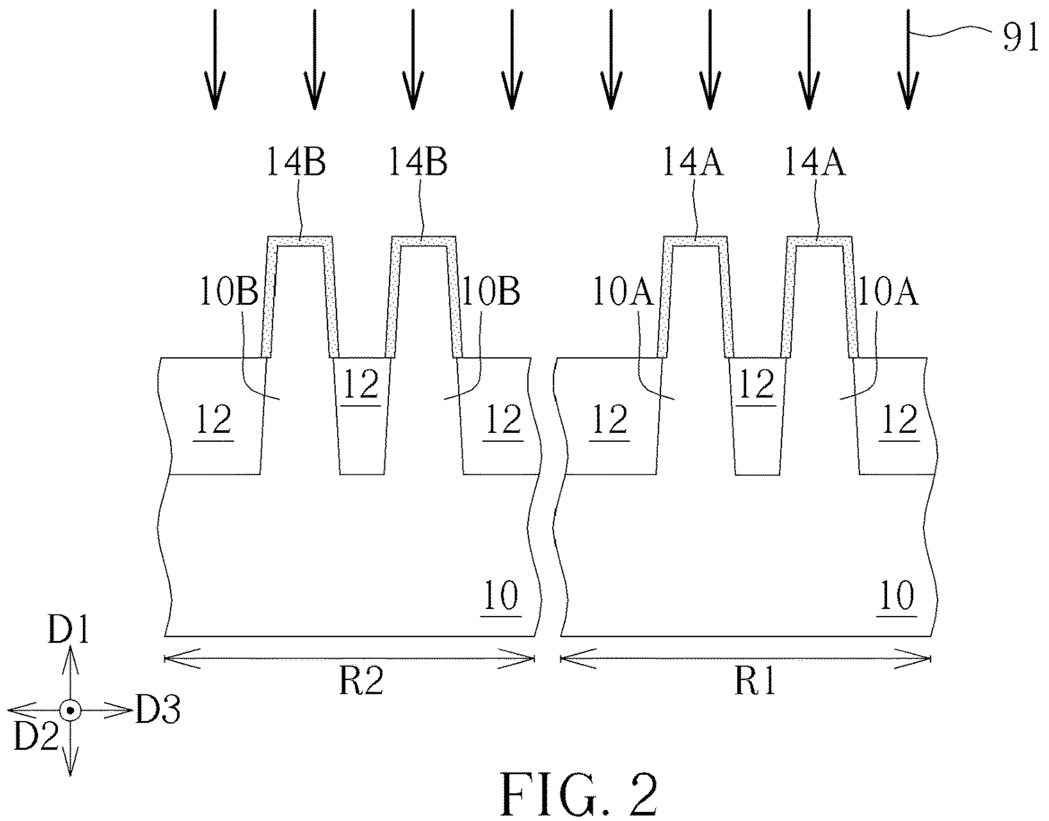
Figure 3:
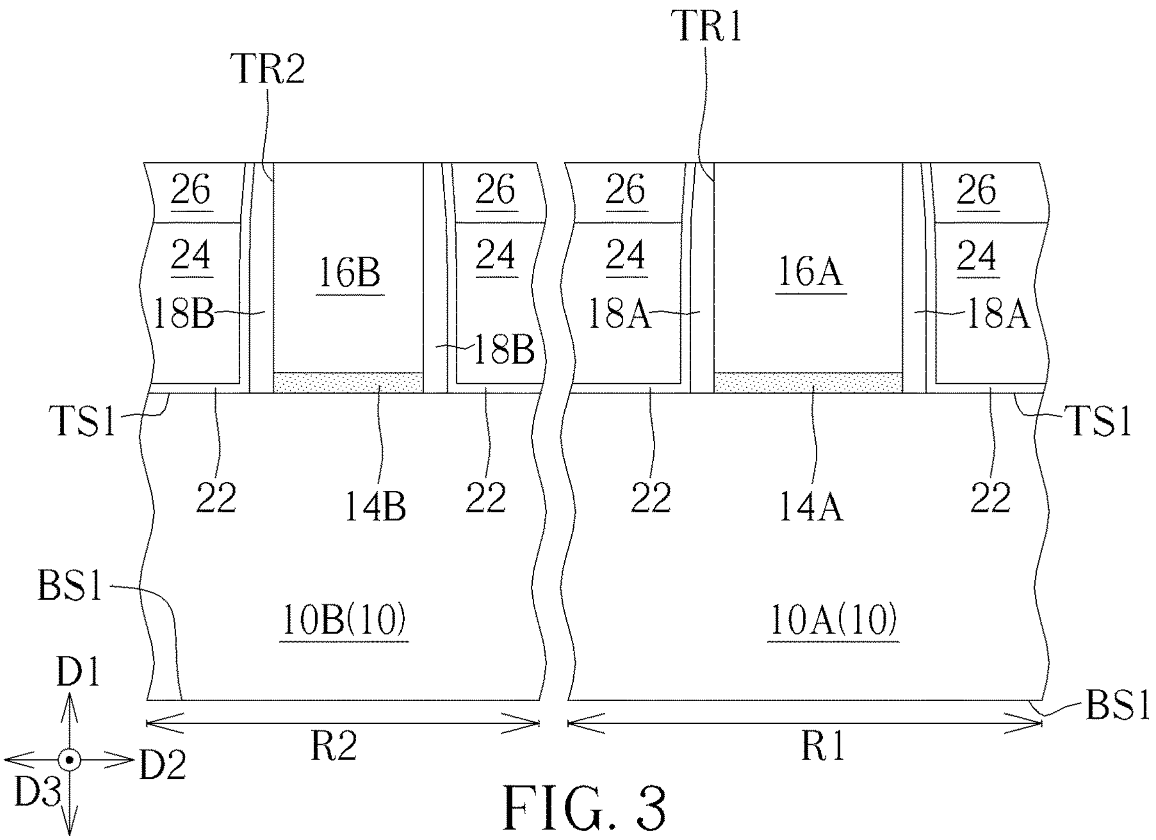
Figure 4:
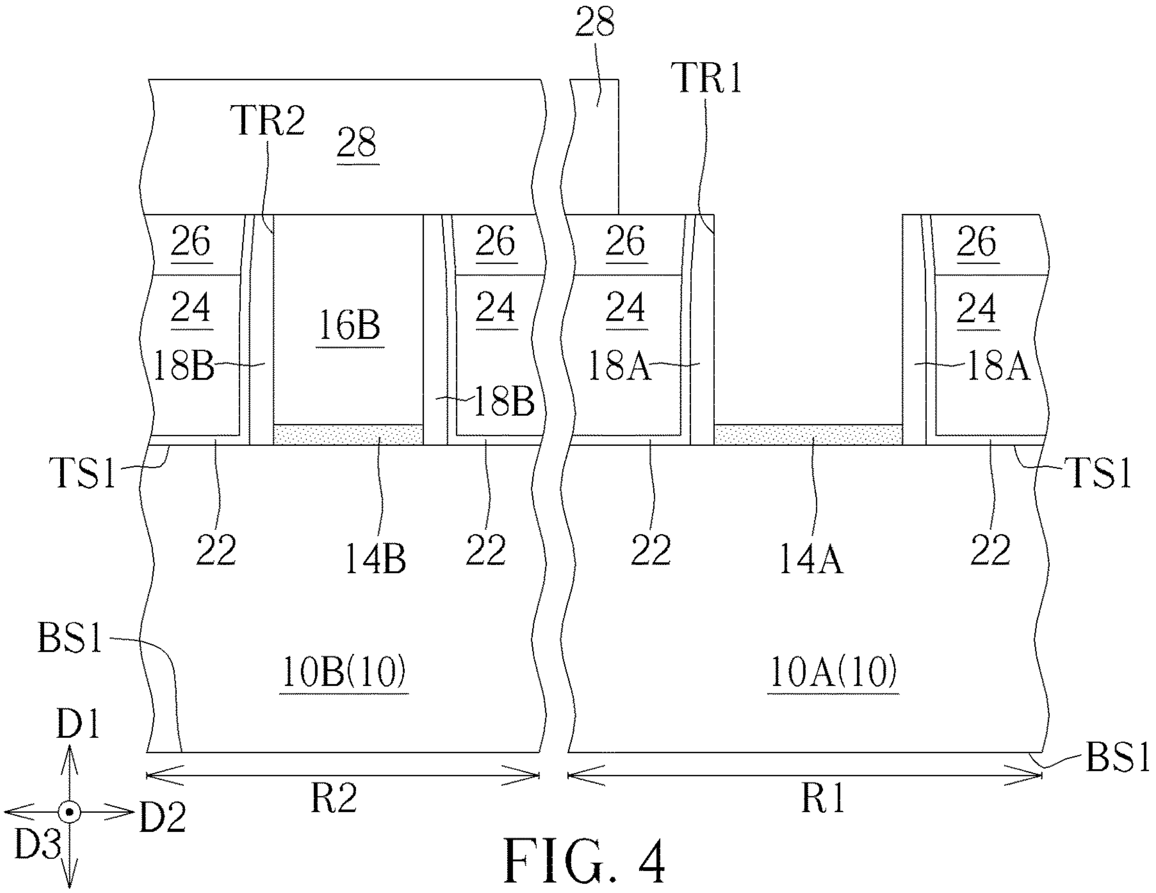
Figure 5:
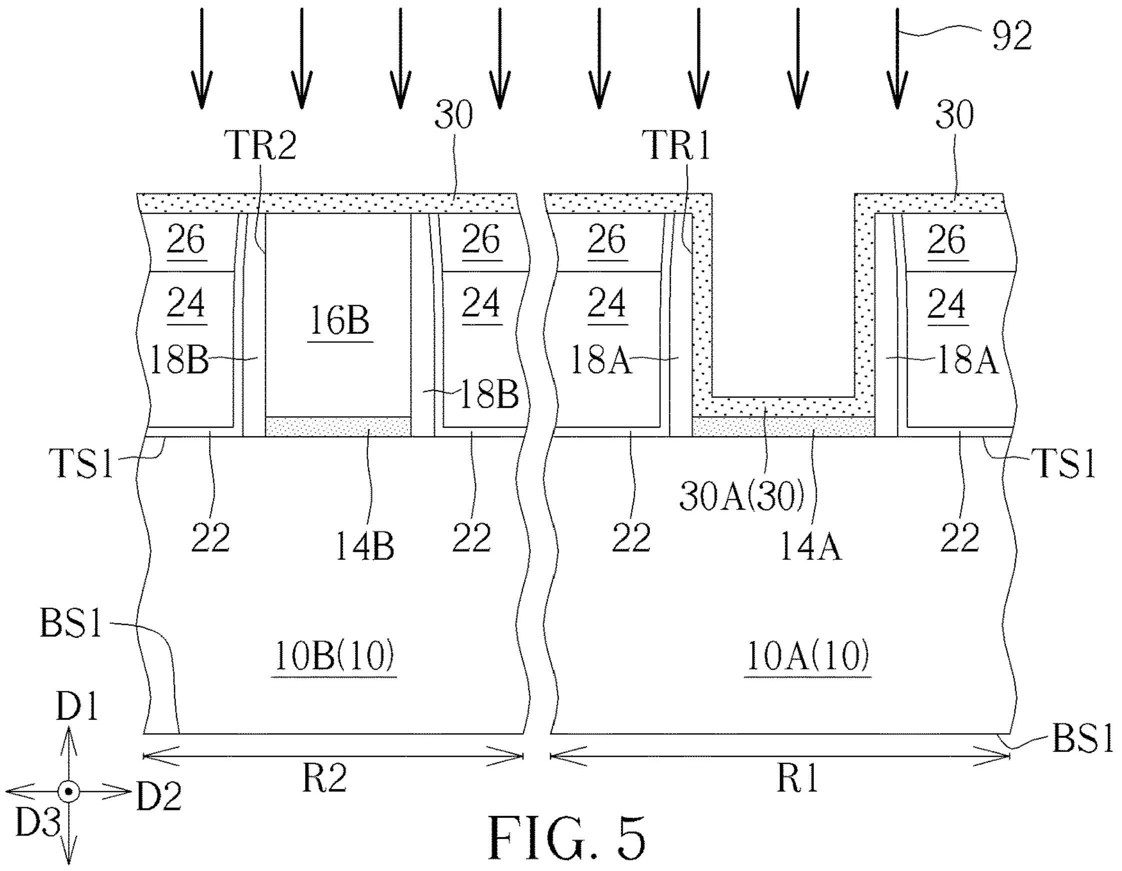
Figure 6:
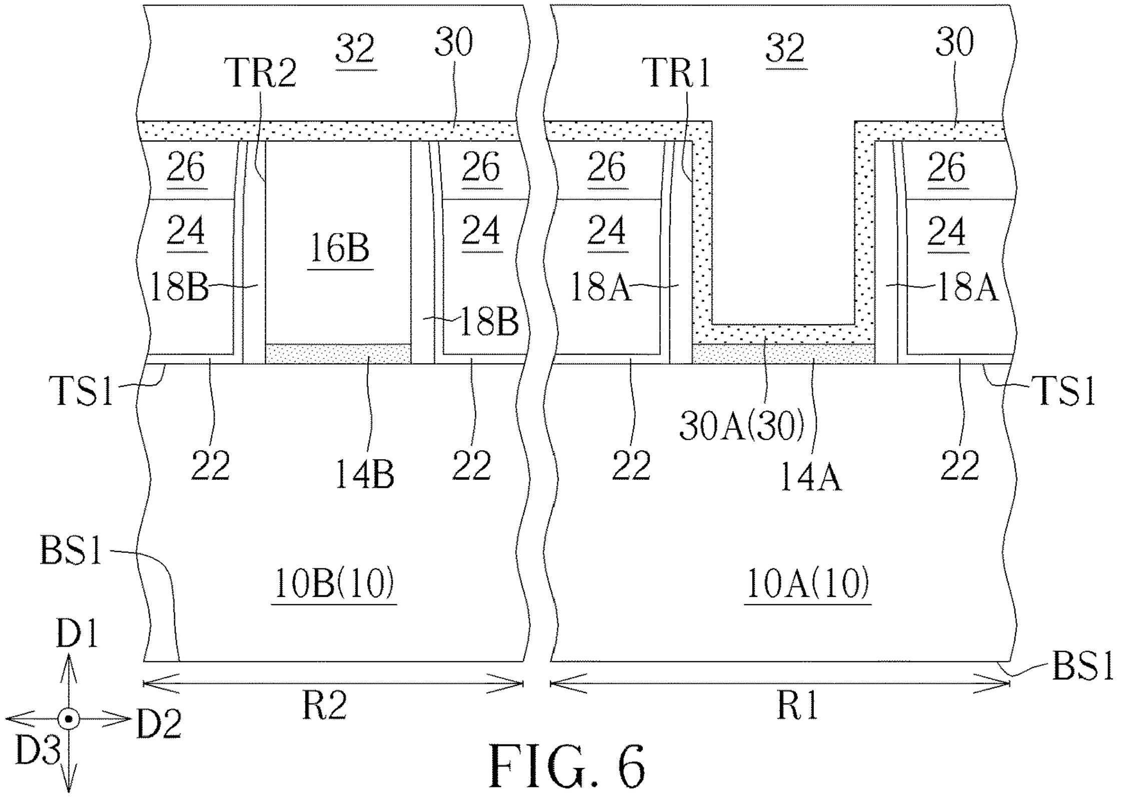
Figure 7:
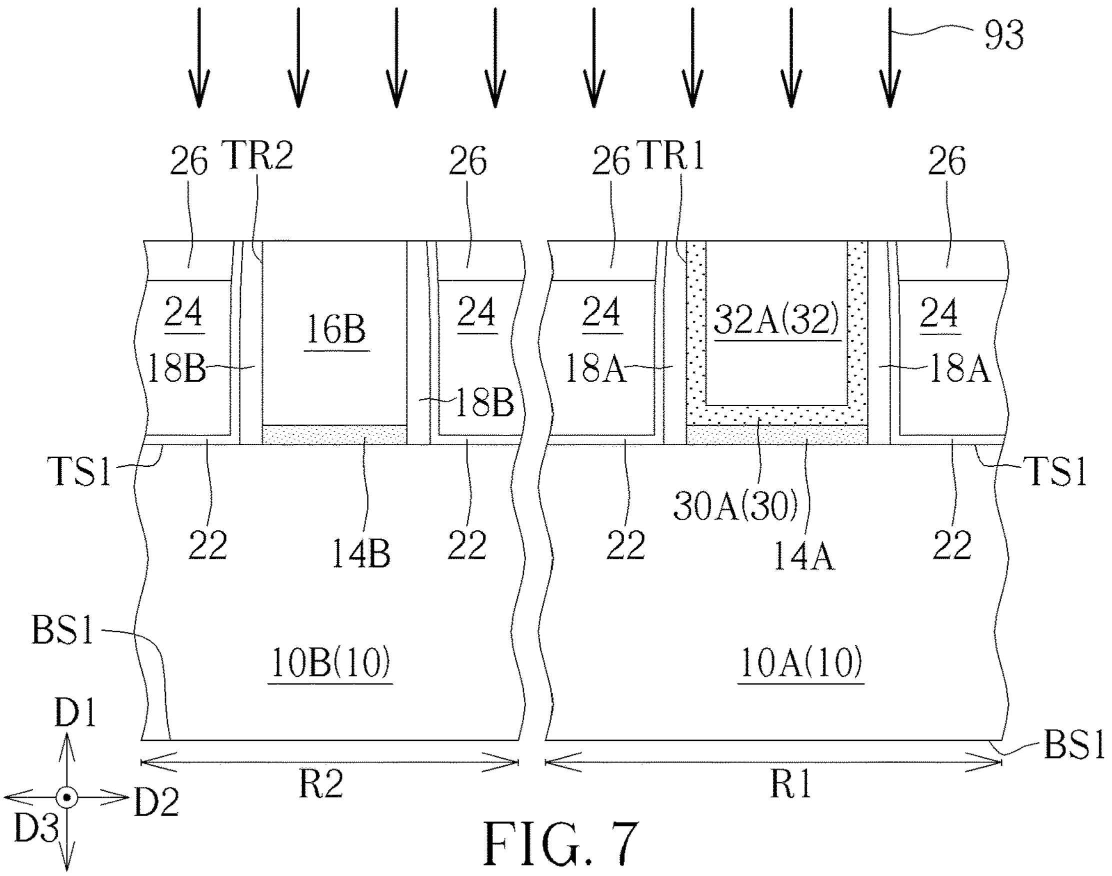
Figure 8:
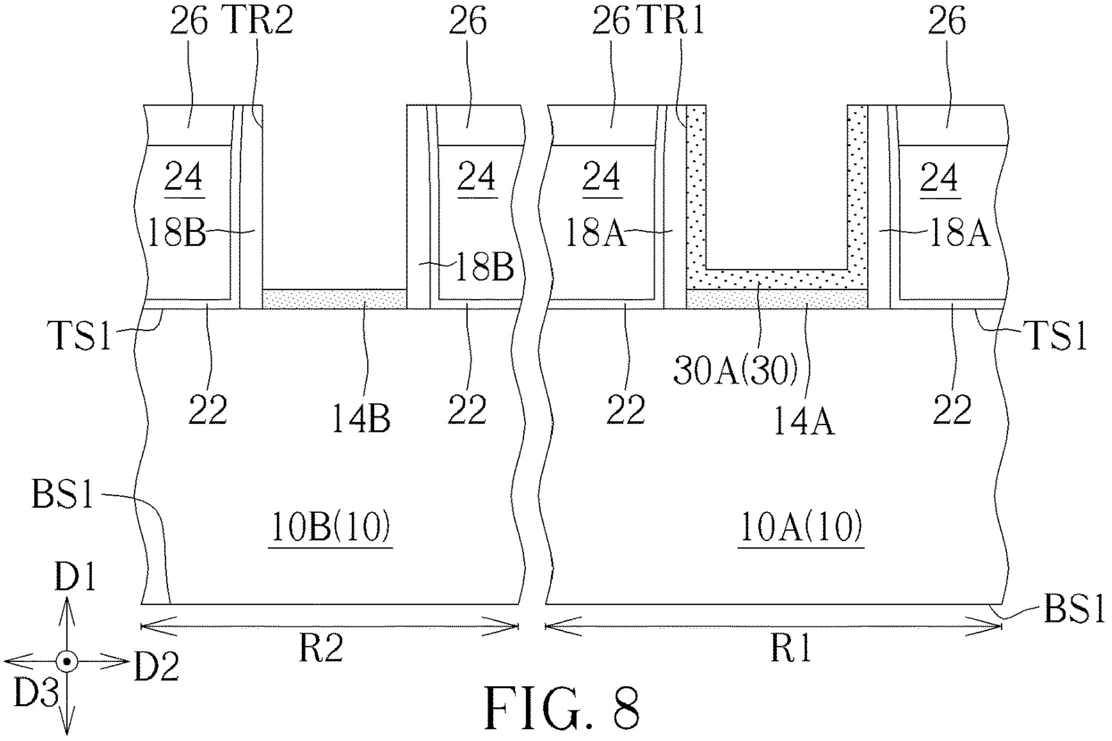

Please refer to FIGS. 1-8. FIGS. 2-8 are schematic drawings illustrating a manufacturing method of a semiconductor structure according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 1 may be regarded as a schematic drawing in a step subsequent to FIG. 8, but not limited thereto. As shown in FIG. 1, the manufacturing method of the semiconductor structure in this embodiment may include the following steps. The semiconductor substrate 10 is provided, and the semiconductor substrate 10 includes the first active structure 10A. The first gate structure GS1 is formed on the first active structure 10A, and the first gate structure GS1 includes the first gate oxide layer (such as the gate oxide layer 30A) and the first high-k dielectric layer 42A. The gate oxide layer 30A includes a U-shaped structure in a cross-sectional view of the first gate structure GS1, and the first high-k dielectric layer 42A is disposed on the gate oxide layer 30A. The first spacer structure 18A is formed. The first spacer structure 18A is disposed on the sidewall of the first gate structure GS1, and the first portion P1 of the gate oxide layer 30A is located between the first spacer structure 18A and the first high-k dielectric layer 42A in the horizontal direction (such as the direction D2).

Specifically, the manufacturing method of the semiconductor structure 100 in this embodiment may include but is not limited to the following steps. As shown in FIG. 2, a plurality of the first active structures 10A and a plurality of the second active structures 10 may be formed by patterning the semiconductor substrate 10, the first active structures 10A are located in the first region R1 of the semiconductor substrate 10, and the second active structures 10B are located in the second region R2 of the semiconductor substrate 10. Subsequently, an isolation structure 12 may be formed for providing isolation effect between the first active structures 10A and between the second active structures 10B. The isolation structure 12 may include a single layer or multiple layers of insulation materials, such as oxide insulation materials, nitride insulation materials, or other suitable insulation materials. Subsequently, the gate oxide layer 14A and the gate oxide layer 14B may be formed on the first active structures 10A and the second active structures 10B, respectively. In some embodiments, the gate oxide layer 14A and the gate oxide layer 14B may be formed concurrently by the same manufacturing process (such as an oxidation process 91), and the material composition of the gate oxide layer 14A may be identical to or similar to the material composition of the gate oxide layer 14B accordingly, but not limited thereto. In some embodiments, the gate oxide layer 14A and the gate oxide layer 14B may be formed by different processes and/or made of different materials according to some design considerations.

In some embodiments, the oxidation process 91 may be performed to a portion of the first active structure 10A exposed without being covered by the isolation structure 12 and a portion of the second active structure 10B exposed without being covered by the isolation structure 12 for generating oxidation effect and forming the gate oxide layer 14A and the gate oxide layer 14B, and a part of the first active structure 10A and a part of the second active structure 10B will be consumed in the formation of the gate oxide layer 14A and the gate oxide layer 14B. Therefore, when the first active structure 10A and the second active structure 10B are fin-shaped semiconductor structures, the thickness of the gate oxide layer 14A and the thickness of the gate oxide layer 14B have to be limited for avoiding excessively changing the dimension of the fin-shaped semiconductor structures, and some specific thickness requirement cannot be met accordingly. Additionally, in some embodiments, the oxidation process 91 may include a thermal oxidation process, such as rapid thermal oxidation (RTO), or other suitable oxidation approaches, and the thermal oxidation process may include an in-situ-steam-generation (ISSG) process or other suitable thermal oxidation approaches.

Subsequently, as shown in FIG. 2 and FIG. 3, a dummy gate 16A and a dummy gate 16B may be formed on the gate oxide layer 14A and the gate oxide layer 14B, respectively. In some embodiments, the dummy gate 16A and the dummy gate 16*b* may be formed concurrently by performing a patterning process to the same materials layer (such as a dummy gate material layer), and the gate oxide layer 14A without being covered by the dummy gate 16A in the direction D1 and the gate oxide layer 14B without being covered by the dummy gate 16B in the direction D1 may be removed in this patterning process, but not limited thereto. The dummy gate material layer described above may include polysilicon or other suitable dummy gate materials, and the first spacer structure 18A, the second spacer structure 18B, the etching stop layer 22, the dielectric layer 24, and a dielectric layer 26 may be formed after the step of forming the dummy gate 16A and the dummy gate 16B. The first spacer structure 18A may be formed on the sidewall of the dummy gate 16A and the sidewall of the gate oxide layer 14A, and the second spacer structure 18B may be formed on the sidewall of the dummy gate 16B and the sidewall of the gate oxide layer 14B. The first spacer structure 18A may surround the dummy gate 16A and the gate oxide layer 14A in the horizontal directions (such as the direction D2 and/or the direction D3), and the second spacer structure 18B may surround the dummy gate 16B and the gate oxide layer 14B in the horizontal directions (such as the direction D2 and/or the direction D3). In other words, the dummy gate 16A and the gate oxide layer 14A may be regarded as being located in the first trench TR1 surrounded by the first spacer structure 18A, the dummy gate 16B and the gate oxide layer 14B may be regarded as being located in the second trench TR2 surrounded by the second spacer structure 18B, the first trench TR1 may be fully filled with the dummy gate 16A and the gate oxide layer 14A, and the second trench TR2 may be fully filled with the dummy gate 16B and the gate oxide layer 14B, but not limited thereto. In addition, the dielectric layer 26 may be formed on the dielectric layer 24, and the dielectric layer 26 and the dielectric layer 24 may be formed by different processes, respectively, and have different material characteristics. For example, in some embodiments, the dielectric layer 24 may be formed by a flowable chemical vapor deposition (FCVD) process and have better gap-filling performance, and the dielectric layer 26 may be formed by a high density plasma chemical vapor deposition (HDP-CVD) process, but not limited thereto.

In some embodiments, a planarization process may be performed to the etching stop layer 22, the dielectric layer 26, and the material used to form the first spacer structure 18A and the second spacer structure 18B so as to expose the top of the dummy gate 16A and the top of the dummy gate 16B. Subsequently, as shown in FIG. 3 and FIG. 4, the dummy gate 16A may be removed for exposing the gate oxide layer 14A. In other words, the dummy gate 16A is removed after the dummy gate 16B and the second spacer structure 18B are formed. In some embodiments, a patterned mask layer 28 may be formed covering the material layers located above the second region R2 for keeping the dummy gate 16B on the second region R2 from being removed in the step of removing the dummy gate 16A. The patterned mask layer 28 may include patterned photoresist or other suitable mask materials, and the patterned mask layer 28 may be removed after the step of removing the dummy gate 16A. As shown in FIGS. 4-7, the gate oxide layer 30A may be formed on the gate oxide layer 14*a* after the dummy gate 16A is removed.

The method of forming the gate oxide layer 30A may include but is not limited to the following steps. As shown in FIG. 4 and FIG. 5, after the step of removing the dummy gate 16A, an oxide layer 30 may be formed on the semiconductor substrate 10. A portion of the oxide layer 30 may be formed conformally in the first trench TR1, and another portion of the oxide layer 30 may be formed outside the first trench TR1, such as being formed on the dielectric layer 26 located above the first region R1 and formed on the dummy gate 16*b*, the second spacer structure 18B, and the dielectric layer 26 located above the second region R2, but not limited thereto. The oxide layer 30 formed in the first trench TR1 may be regarded as the gate oxide layer 30A described above, the oxide layer 30 may be formed by a deposition process 92, and the gate oxide layer 30A may be regarded as being formed by the deposition process 92 also. In some embodiments, the deposition process 92 may include an atomic layer deposition (ALD) process or other suitable deposition approaches. Subsequently, as shown in FIG. 5 and FIG. 6, a dummy gate material 32 may be formed on the oxide layer 30 after the deposition process 92, and the dummy gate material 32 may include polysilicon or other suitable materials. A portion of the dummy gate material 32 may be formed in the first trench TR1, and another portion of the dummy gate material 32 may be formed outside the first trench TR1. As shown in FIG. 6 and FIG. 7, a planarization process 93 may then be performed for removing the oxide layer 30 located outside the first trench TR1 and the dummy gate material 32 located outside the first trench TR1. In some embodiments, the first trench TR1 may be fully filled with the gate oxide layer 14A, the oxide layer 30, and the dummy gate 32. The dummy gate material 32 remains in the first trench TR1 after the planarization process 93 may become the dummy gate 32A, and the oxide layer 30 remains in the first trench TR1 after the planarization process 93 may become the gate oxide layer 30A. Therefore, the dummy gate 32A may be regarded as being formed on the gate oxide layer 30A, and the first spacer structure 18A may surround the dummy gate 32A, the gate oxide layer 30A, and the gate oxide layer 14A in the horizontal directions (such as the direction D2 and/or the direction D3). In some embodiments, a portion of the dielectric layer 26, a portion of the etching stop layer 22, a portion of the first spacer structure 18A, a portion of the second spacer structure 18B, and a portion of the dummy gate 16B may be removed by the planarization process 93, but not limited thereto. It is worth noting that the gate oxide layer 14B located on the second region R2 may be covered and protected by the dummy gate 16B and the second spacer structure 18B during the step of removing the oxide layer 30 located outside the first trench TR1 for reducing the negative influence of the process of removing the gate oxide layer 30 (such as the planarization process 93) on the gate oxide layer 14B and improving the material condition and/or the thickness control of the gate oxide layer 14B.

As shown in FIG. 7 and FIG. 8, after the planarization process 93, the dummy gate 16B and the dummy gate 32A may be removed for exposing the gate oxide layer 30A in the first trench TR1 (such as the second portion of the gate oxide layer 30A described above) and the gate oxide layer 14B in the second trench TR2. As shown in FIG. 7, FIG. 8, and FIG. 1, after the step of removing the dummy gate 16B and the dummy gate 32A, the first high-k dielectric layer 42A, the first electrically conductive layer 44A, the first gate electrode 46A, and the first capping layer 48A may be formed in the first trench TR1, and the second high-k dielectric layer 42B, the second electrically conductive layer 44B, the second gate electrode 46B, and the second capping layer 48B may be formed in the second trench TR2 for forming the semiconductor structure 100 illustrated in FIG. 1. In some embodiments, an etching back process may be performed in the processes of forming the first high-k dielectric layer 42A, the second high-k dielectric layer 42B, the first electrically conductive layer 44A, the second electrically conductive layer 44B, the first gate electrode 46A, and the second gate electrode 46B. The etching rate of the material of the first gate electrode 46A and the second gate electrode 46B in the etching back process may be relative low. Therefore, after the etching back process, the top surfaces of the gate oxide layer 30A, the first high-k dielectric layer 42A, and the first electrically conductive layer 44A may be lower than the top surface of the first gate electrode 46A in the direction D1, and the top surface of the second high-k dielectric layer 42B and the top surface of the second electrically conductive layer 44B may be lower than the top surface of the second gate electrode 46B in the direction D1, but not limited thereto. Additionally, in some embodiments, the first capping layer 48A and the second capping layer 48B may be formed by filling the first trench TR1 and the second trench TR2 with an insulation material and performing a planarization process to the insulation material, and a portion of the etching stop layer 22, a portion of the first spacer structure 18A, a portion of the second spacer structure 18B, and the dielectric layer 26 may be removed by this planarization process, but not limited thereto.

The semiconductor structure 100 shown in FIG. 1 may be formed by the manufacturing method described above. The first gate structure GS1 is formed on the first active structure 10A, the second gate structure GS2 is formed on the second active structure 10, and the structural composition of the first gate structure GS1 may be different from that of the second gate structure GS2. It is worth noting that, in the present invention, the method of forming the first gate structure GS1 and the second gate structure GS2 may include but is not limited to the manufacturing steps shown in FIGS. 2-8 described above. In other words, the semiconductor structure 100 illustrated in FIG. 1 may be formed by other methods according to some design considerations. In the first gate structure GS1, the gate oxide layer 30A may be used to increase the total thickness of the gate oxide layers in the first gate structure GS1, so as to meet the design requirements of the corresponding semiconductor device. Additionally, by the manufacturing method described above, excessive damage to the active structures generated by the step of forming a thicker gate oxide layer may be avoided and/or damage to the gate oxide layer remaining in a particular area generated by the step of removing a portion of the gate oxide layer in this area (such as the step of removing the oxide layer 30 on the second region R2 shown in FIGS. 6-7 described above) may be avoided. The manufacturing yield may be enhanced accordingly.

To summarize the above descriptions, in the semiconductor structure and the manufacturing method thereof according to the present invention, the gate oxide layers may be formed by different approaches so as to form the gate oxide layers with different thickness in the gate structures on different regions and meet the design requirements of the corresponding semiconductor devices. Additionally, the negative influence of the related processes may be reduced by the manufacturing method in the present invention, the manufacturing yield may be enhanced and/or the product operation performance may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:

a semiconductor substrate comprising a first active structure;

a first gate structure disposed on the first active structure, wherein the first gate structure comprises:

a first gate oxide layer, wherein the first gate oxide layer comprises a U-shaped structure in a cross-sectional view of the first gate structure;

a first high dielectric constant (high-k) dielectric layer disposed on the first gate oxide layer;

a gate electrode disposed on the first high-k dielectric layer, wherein the first high-k dielectric encompasses a lower part of the gate electrode;

an electrically conductive layer disposed between the first high-k dielectric layer and the gate electrode; and a capping layer disposed on the first gate oxide layer, the first high-k dielectric layer, the electrically conductive layer, and the gate electrode; and a first spacer structure disposed on a sidewall of the first gate structure, wherein a first portion of the first gate oxide layer is located between the first spacer structure and the first high-k dielectric layer in a horizontal direction, and a thickness of the first gate oxide layer is greater than a thickness of the first high-k dielectric layer, wherein a top surface of the first portion of the first gate oxide layer, a top surface of the first high-k dielectric layer, and a top surface of the electrically conductive layer are lower than a top surface of the gate electrode and higher than a bottom surface of the gate electrode in a vertical direction, and the capping layer is directly connected with the top surface of the first portion of the first gate oxide layer, the top surface of the first high-k dielectric layer, the top surface of the electrically conductive layer, and the top surface of the gate electrode.

2. The semiconductor structure according to claim 1, wherein the first portion of the first gate oxide layer is sandwiched between the first high-k dielectric layer and the first spacer structure in the horizontal direction.

3. The semiconductor structure according to claim 2, wherein the first portion of the first gate oxide layer is directly connected with the first high-k dielectric layer and the first spacer structure in the horizontal direction.

4. The semiconductor structure according to claim 1, wherein the first gate structure further comprises:

a second gate oxide layer, wherein the first gate oxide layer is disposed on the second gate oxide layer, and a second portion of the first gate oxide layer is sandwiched between the first high-k dielectric layer and the second gate oxide layer in the vertical direction.

5. The semiconductor structure according to claim 4, wherein the second portion of the first gate oxide layer is directly connected with the first high-k dielectric layer and the second gate oxide layer.

6. The semiconductor structure according to claim 4, further comprising:

a second gate structure, wherein the semiconductor substrate further comprises a second active structure, the second gate structure is disposed on the second active structure, and the second gate structure comprises:

a third gate oxide layer; and a second high-k dielectric layer disposed on the third gate oxide layer, wherein the third gate oxide layer is directly connected with the second active structure and the second high-k dielectric layer.

7. The semiconductor structure according to claim 6, wherein a thickness of the third gate oxide layer in the vertical direction is less than a total thickness of the first gate oxide layer and the second gate oxide layer in the vertical direction.

8. The semiconductor structure according to claim 6, further comprising:

a second spacer structure disposed on a sidewall of the second gate structure, wherein the second high-k dielectric layer is directly connected with the second spacer structure.

9. The semiconductor structure according to claim 1, wherein the top surface of the first portion of the first gate oxide layer is lower than a top surface of the first spacer structure in the vertical direction.

10. The semiconductor structure according to claim 1, wherein the first active structure comprises a fin-shaped semiconductor structure.

* * * * *